(12) United States Patent
Urata et al.

(10) Patent No.: US 9,001,852 B1
(45) Date of Patent: Apr. 7, 2015

(54) WAVELENGTH TUNABLE LASER

(71) Applicant: Google Inc., Mountain View, CA (US)

(72) Inventors: Ryohei Urata, San Carlos, CA (US); Pedram Zare Dashti, Los Gatos, CA (US); Cedric Fung Lam, Belmont, CA (US); Xiangjun Zhao, Fremont, CA (US); Hong Liu, Palo Alto, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 14/023,104

(22) Filed: Sep. 10, 2013

(51) Int. Cl.
*H01S 3/10* (2006.01)
*H01S 5/024* (2006.01)

(52) U.S. Cl.
CPC .................................. *H01S 5/02415* (2013.01)

(58) Field of Classification Search
USPC .......................................................... 372/20
See application file for complete search history.

(56) References Cited

U.S. PATENT DOCUMENTS

| | | | |
|---|---|---|---|
| 6,201,824 B1 * | 3/2001 | Hong et al. ................. | 372/50.11 |
| 7,106,774 B2 * | 9/2006 | Fisher ........................ | 372/46.01 |
| 7,112,827 B2 | 9/2006 | Hayakawa et al. | |
| 7,265,898 B2 | 9/2007 | Wang et al. | |
| 7,609,977 B2 | 10/2009 | Matsui et al. | |
| 8,306,076 B2 | 11/2012 | Ikagawa | |
| 2012/0027041 A1 | 2/2012 | Yamazaki | |
| 2012/0163405 A1 | 6/2012 | Su et al. | |
| 2013/0003762 A1 | 1/2013 | Kaneko | |
| 2013/0044768 A1 | 2/2013 | Ter-Mikirtychev | |

FOREIGN PATENT DOCUMENTS

WO   WO-2004068764 A1   8/2004

\* cited by examiner

*Primary Examiner* — Xinning Niu
(74) *Attorney, Agent, or Firm* — Honigman Miller Schwartz and Cohn LLP

(57) ABSTRACT

The wavelength tunable laser includes a thermo-electric cooler (TEC), a distributed feedback portion, and a semiconductor optical amplifier (SOA). The distributed feedback portion is disposed on the thermo-electric cooler and has a plurality of distributed feedback (DFB) lasers connected in series. Each DFB laser is configured to output an optical signal within a different temperature dependent tunable range of wavelengths. Therefore, the distributed feedback portion outputs an optical signal from one of the DFB lasers. The SOA is optically connected to the distributed feedback portion. The SOA amplifies and modulates the optical signal outputted from the distributed feedback portion.

16 Claims, 4 Drawing Sheets

WAVELENGTH TUNABLE LASER

TECHNICAL FIELD

This disclosure relates to a wavelength tunable laser,

BACKGROUND

A basic communication system includes a transmitter that converts a message from an electrical form to a form suitable to be transferred over a communication channel. The communication channel transfers the message from the transmitter to the receiver. The receiver receives the message and converts it back to its original form.

Fiber optic communication is an emerging method of transmitting information from a source (transmitter) to a destination (receiver) using optical fibers as the communication channel. Optical fibers are flexible, transparent fibers made of thin glass silica or plastic that transmits light throughout the length of the fiber between the source and the destination. Fiber optic communications allows for the transmission of data over longer distances and at higher bandwidth than other known forms of communications. Fiber optics are an improved form of communication over metal wires because the light traveled through the fiber experiences less loss and is immune to electromagnetic interferences. Companies use optical fibers to transmit telephone signals, internet communication, and cable television signals.

SUMMARY

In wavelength-division multiplexing passive optical networks (WDM-PON), a communication path from a central office (CO) to each user is generally mapped to a specific wavelength. This disclosure provides a wavelength tunable laser that can be tuned at the time of deployment for each particular path/user at each optical network unit (ONU) (e.g., at the customer premises (CP)), which allows the use of a single flavor of transceiver and CP device across all users, thus streamlining operation by simplifying the installation complexity and reducing sparing and inventory as welt as cost. Similar benefits can be envisaged in any WDM based system to reduce sparing.

One aspect of the disclosure provides a wavelength tunable laser that includes a thermo-electric cooler (TEC), a distributed feedback portion, and a semiconductor optical amplifier (SOA). The distributed feedback portion is disposed on the TEC and has a plurality of distributed feedback (DFB) lasers connected in series. Each DFB laser is configured to output an optical signal within a different temperature dependent tunable range of wavelengths. Therefore, the distributed feedback portion outputs an optical signal from one of the DFB lasers. The SOA is optically connected to one end of the distributed feedback portion. The SOA amplifies and may also modulate the optical signal outputted from the distributed feedback portion.

Implementations of the disclosure may include one or more of the following features. In some implementations, the distributed feedback portion outputs an optical signal from one of the DFB lasers having a temperature dependent tunable wavelength range encompassing a temperature of the distributed feedback portion. The TEC controls the temperature of the distributed feedback portion. The SOA may amplify and modulate the optical signal based on which DFB laser outputs the optical signal. Additionally or alternatively, the SOA may amplify and modulate the optical signal of a first DFB laser greater than a second DFB laser. The first DFB laser is positioned in the series of DFB lasers further away from the SOA than the second DFB laser.

In some examples, the wavelength tunable laser includes a controller in communication with the distributed feedback portion. The controller activates one DFB laser at a time to output an optical signal. The controller may also be in communication with the SOA. The controller sets a gain of the SOA to amplify the optical signal by amplification dependent on a position in the series of DFB lasers of the DFB laser outputting the optical signal with respect to the SOA. In addition, the controller sets a modulation of the semiconductor optical amplifier, the modulation corresponding to the DFB laser outputting the optical signal. Additionally, the controller may communicate with and control the TEC to change a temperature of the distributed feedback portion to be a lasing temperature within the temperature dependent tunable wavelength range of one of the DFB lasers.

In some examples, each DFB laser includes an optical grating for reflecting light. The optical grating of each DFB laser is different than another optical grating of any other DFB laser within the distributed feedback portion so that each DFB laser outputs an optical signal having a different wavelength than another DFB laser within the distributed feedback portion.

Each DFB laser within the distributed feedback portion may be associated with a different grating pitch. The grating pitch is different for each distributed feedback laser outputting a different temperature dependent tunable range of wavelengths. The index of refraction changes with a change in temperature In some examples, each DFB laser within the distributed feedback portion is calibrated at first and second temperature extremes of a collective range of the temperature dependent tunable range of wavelengths.

Another aspect of the disclosure provides a method of tuning optical signals. The method includes activating a DFB laser from a plurality of DFB lasers that are connected in series to output an optical signal. Each DFB laser is configured to output an optical signal within a different temperature dependent tunable range of wavelengths. The method includes amplifying the optical signal using an SOA optically connected to one end of the plurality of DFB lasers, and optionally modulating the optical signal using the SOA. The method further includes maintaining a temperature of the DFB lasers (e.g., using the TEC).

In some implementations, the method further includes amplifying the optical signal based on a position of the DFB laser in the series of DFB lasers with respect to the SOA. Additionally, the method may include amplifying the optical signal of a first DFB laser greater than a second DFB laser. The first DFB laser is positioned in the series of DFB lasers further away from the SOA than the second DFB laser. Additionally or alternatively, the method may include activating one DFB laser at a time to output an optical signal.

In some examples, the method further includes setting a gain of the SOA to amplify the optical signal by an amplification dependent on a position in the series of DFB lasers of the DFB laser outputting the optical signal with respect to the SOA. The method may also include setting a modulation of the SOA where the modulation corresponds to the DFB laser outputting the optical signal.

The method may further include altering a temperature of the DFB lasers to change a lasing wavelength within the temperature dependent tunable wavelength range of one of the DFB lasers. Additionally or alternatively, the method may include controlling a refractive index of each of the DFB lasers by maintaining the temperature of the DFB lasers. The refractive index controls the optical signal outputted within a different temperature dependent tunable range of wavelengths.

In some examples, the method includes calibrating a wavelength of an optical signal at first and second temperature extremes of a collective range of the temperature dependent tunable range of wavelengths.

Each DFB laser may include an optical grating for reflecting light, where the optical grating of each DFB laser is different than another optical grating of any other DFB laser. Additionally or alternatively, the series of DFB lasers may include a head DFB laser and an end DFB laser. The end DFB laser is optically connected to the SOA and any optical signals from the other DFB lasers pass through the DFB lasers in between that laser and the end DFB laser.

The details of one or more implementations of the disclosure are set forth in the accompanying drawings and the description below. Other aspects, features, and advantages will be apparent from the description and drawings, and from the claims.

DESCRIPTION OF DRAWINGS

Like reference symbols in the various drawings indicate like elements.

DETAILED DESCRIPTION

Figure 1:
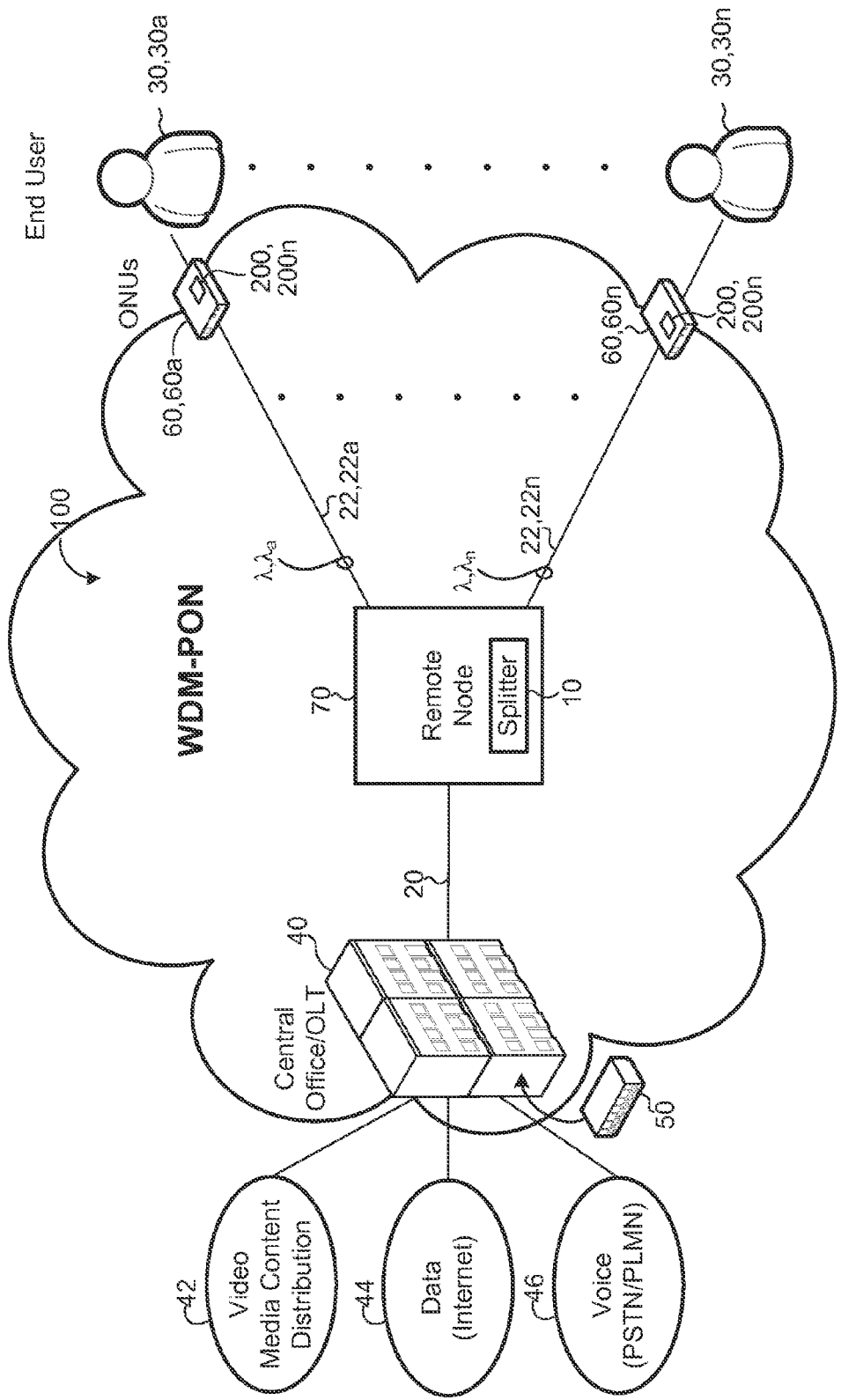
FIG. 1 is a schematic view of an exemplary passive optical network using an exemplary wavelength tunable laser.

Fiber-to-the-home (FTTH) is the delivery of a communication signal through optical fibers from a central office (CO) or optical line terminal (OLT) to a home or a business of a user. Referring to FIG. 1, a passive optical network (PON) 100 is a point-to-multipoint network architecture that uses optical splitters 10 to enable a single optical fiber feeder 20 to serve multiple users 30a-30n (e.g. 16-128). The PON 100 provides optical signals from a CO 40 and includes an optical line terminal 50 (e.g., optical transmitter/receiver or transceiver) to a number of optical network units/terminals (ONUs) 60. Each ONU 60 includes an optical transmitter/receiver (i.e., transceiver) for transmitting and receiving data from the CO 40. In some examples, the PON 100 includes multiple optical transmitter/receiver or transceiver systems 50, 60. One feeder fiber 20 is sent from the CO 40 to a remote node 70, where the signal is split and distributed to many (e.g., 16, 205 or more) different ONUs 60a-60n via fiber feeders 22, 22a-22n.

In some implementations, a wave division multiplexed passive optical network (WDM-PON) 100 provides CO fiber termination consolidation, bandwidth scalability and the easy-to-understand end-to-end Ethernet transparency, WDM-PON offers every broadband subscriber 30 a separate wavelength; thus offering privacy to each user. A WDM-PON network 100 uses a wavelength demultiplexer to distribute optical signals to end-users 30 through a home fiber 22. Optical beams having different wavelengths λ propagate without interfering with one another. This allows for several channels of information where each has a different wavelength λ to be transmitted simultaneously over a single optical fiber 20, 22. Therefore, the capacity of a WDM-PON network is limited by the number of wavelengths λ available in a WDM-PON network 100. In addition, each wavelength in a WDM-PON network 100 may run at a different speed; therefore, the speed of each individual user 30 may be individually upgraded to a faster speed without updating the speed of other users 30.

There are two types of WDM systems depending on the wavelength patterns: conventional/coarse (CWDM) and dense (DWDM). CWDM provides 20 nm spaced channels. DWDM uses denser channel spacing, but uses the same transmission window as the CWDM. Increasing the number of wavelengths in a system increases the number of users 30 the network 100 can handle. Increasing the total spectrum range to fit more channels increases the number of users 30, but requires a higher accuracy in wavelengths, which increases the number of components used to build the network 100, thus increasing the cost of the network 100.

The CO 40 receives information, such as video media distribution 42, internet data 44, and voice data 46, that may be transferred to the end users 30. The CO 40 includes an optical line terminal (OLT) 50 connecting the optical access network to an IP, ATM, or SONET backbone, for example. Therefore, the OLT 50 is the endpoint of the PON 100 and converts between the electrical signals used by a service provider's equipment and the fiber optic signals used by the PON 100. In addition, OLT 50 coordinates multiplexing between the conversion devices at the user end 30. The OLT 50 sends the fiber optic signal through a feeder fiber 20, and the signal is received by a remote node 70, which demultiplexes the signal and distributes it to multiple users 30.

Figure 3:
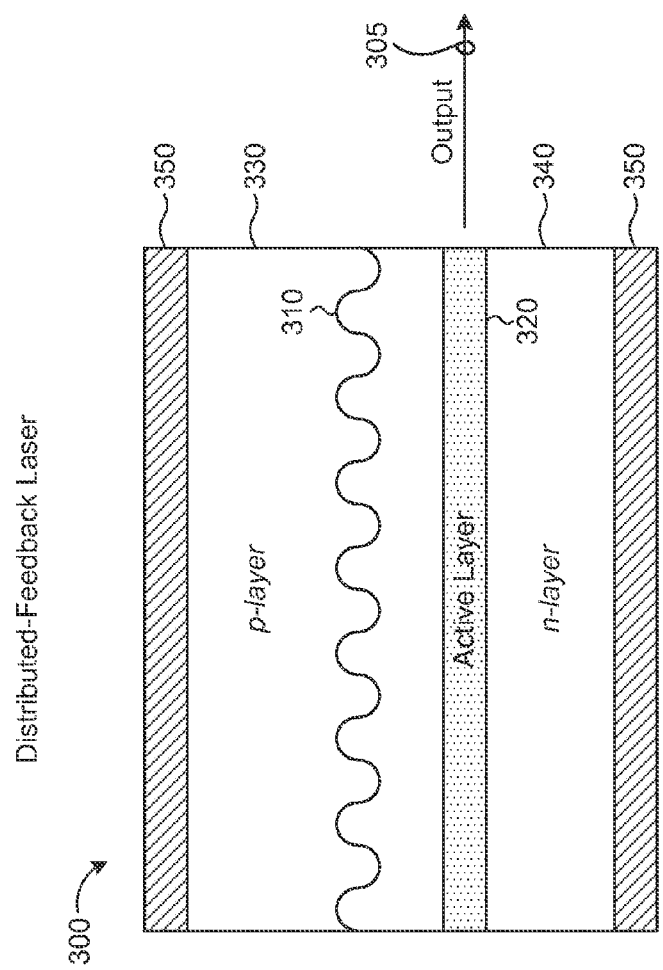
FIG. 3 is a schematic view of a DFB laser used in an exemplary tunable laser.

A transceiver or ONU 60, on the user 30 end, includes a carrier source (e.g., laser diode or light-emitting diode) for generating an optical signal that carries the information to be sent from an end user 30 to the CO 40, A laser is a high-frequency generator or oscillator, which requires amplification, feedback, and a tuning mechanism that determines the frequency. Lasers emit light coherently such that the laser output is a narrow beam of light. In some implementations, a laser includes a medium that provides the amplification and the frequency, and mirrors that provide the feedback. Photons bounce off one mirror through the medium and head back to another mirror to bounce back for further amplification. One, and sometimes both mirrors, may partially transmit light to allow a fraction of the generated light to be emitted. A laser diode is an electrically pumped semiconductor laser having an active medium being a p-n junction (FIG. 3). The p-n junction is created by doping (i.e., introduction of impurities into a pure semiconductor to change its electrical properties).

In a WDM-PON network 100, each user 30 is allocated a different wavelength for upstreaming data to the CO 40. Therefore, each ONU 60 uses a wavelength-specific transmitter, such as a tunable wavelength laser 200, to transmit data to the CO 40 at different wavelengths λ. The tunable wavelength laser 200 may be tuned at the time of deployment for each particular path 22 (corresponding to a user 30), which allows the use of one type of transceiver by all users 30.

Figure 2:
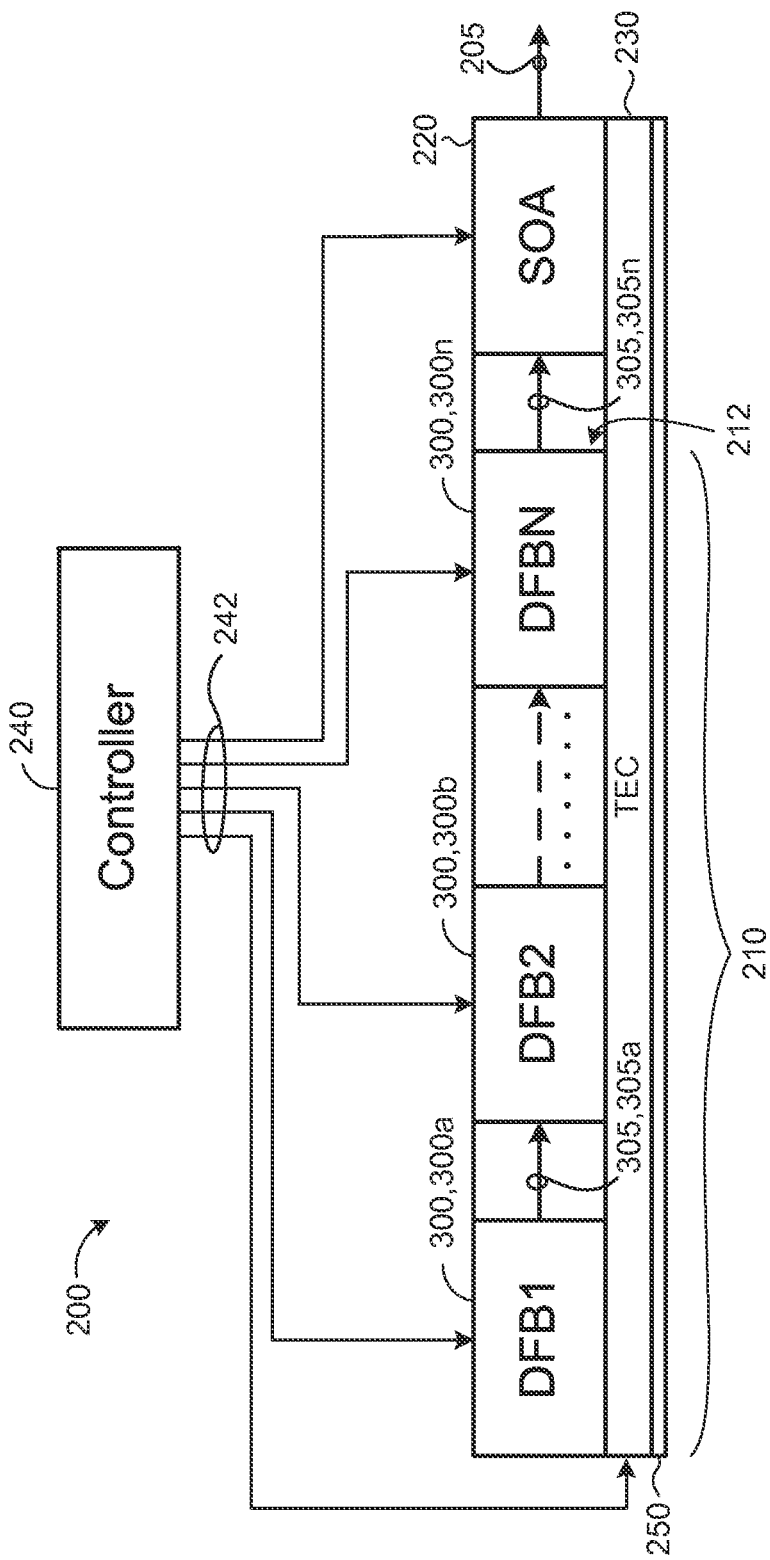
FIG. 2 is a schematic view of an exemplary wavelength tunable laser.

Referring to FIG. 2, in some implementations, a wavelength tunable laser 200 includes a distributed feedback portion 210, a semiconductor optical amplifier (SOA) 220, and a thermo-electric cooler (TEC) 230. The distributed feedback portion 210 (also referred to a laser array) may be disposed on the TEC 230 and includes a plurality of distributed feedback (DFB) lasers 300, 300a-n connected in series. The distributed feedback portion 210 outputs an optical signal 305 from one of the DFB lasers 300, 300a-n. The SOA 220 is connected to an output end 212 of the distributed feedback portion 210 to receive, amplify, and modulate the optical signal 305. In some examples, the tunable laser 200 includes a controller 240 for controlling the operations of each of the DFB lasers 300 within the distributed feedback portion 210, the SOA 220, and the TEC 230.

Tunable lasers 200 operate at different wavelengths λ changed in a controlled manner, as by temperature and/or a control current. A temperature of the TEC 230 may be adjusted to set the index of refraction and hence the lasing wavelength of the tunable laser 200. In some examples, the controller 240 delivers a control current 242 to the TEC 230 to set the temperature of the TEC 230 and therefore the index of refraction of the tunable laser 200. The controller 240 may also deliver the control current 242 to the distributed feedback portion 210 (i.e., to one of the DFB lasers 300 at a time) and the SOA 220.

The tunable wavelength laser 200 is capable of transmitting an optical signal 205 at different wavelengths λ at the ONU 60, which provides for a colorless (i.e., wavelength-independent) ONU 60. Colorless ONUs 60 are a category of ONUs. The term color refers to the color of the wavelength λ. The emission wavelength λ of a colorless ONU 60 is nonspecific and can be determined by external factors (e.g., an electrical control/setting signal). As such, identical ONUs 60 can be mass produced and deployed across the network 100 and each tunable wavelength laser 200 within an ONU 60 can be modulated at the time of data upstream.

The DFB laser 300 is a type of laser diode that can be tuned by either changing the temperature or by changing the control current 242 of the DFB laser 300. The DFB laser 300 has a material refractive index, which is dependent on temperature; therefore, the output wavelength λ of a DFB laser 300 shifts one to a few tenths of a nanometer per degree Celsius when the temperature of the material of the DFB laser 300 changes (which changes the refractive index). Similarly, if the control current 242 is increased, the wavelength tunable laser 200 is heated, its index of refraction changes due to the change in electrical carriers, and the output wavelength λ of the DFB laser 300 outputting a signal 305 is shifted.

As shown in FIG. 3, the DFB laser 300 does not have two spatially distinct mirrors that form an optical cavity like other types of lasers. Instead, the DFB laser 300 has a corrugated layer 310 etched internally above an active layer 320 between a p-type layer 330 and an n-type layer 340. The corrugated layer 310 forms an optical grating that reflects light having a specific wavelength λ. The grating 310 stabilizes the output wavelength λ. The output wavelength λ may change with temperature changes that cause the refractive index of the grating 310 and entire laser to change. The grating 310 acts as the wavelength selection element and provides feedback, reflecting light back into the cavity to form the resonator. The grating 310 of DFB laser 300 reflects a narrow band of wavelengths λ that leads to producing only a single longitudinal lasing mode. When the temperature of the DFB laser 300 changes, the grating 310 changes, because it depends on the refractive index which depends on temperature. Thus, a change in the refractive index alters the wavelength selection of the grating structure 310 and provides a tunable laser 200. Another way to tune the laser 200 is to alter the current powering the laser 200, because the current change causes the temperature and index of refraction to change within the laser 200.

Each DFB laser 300 in the distributed feedback portion 210 is tuned to output an optical signal 305 different than an output signal 305n of another DFB laser 300n in the distributed feedback portion 210. Therefore, the wavelength tunable laser 200 has a wavelength range that equals the range of the summation of wavelengths λ from each DFB laser 300. The distributed feedback portion 210 outputs the optical signal 305 from one of the DFB lasers 300 having a temperature range encompassing a temperature of the distributed feedback portion 210. Titus, each laser 200 is capable of operating at a range of wavelengths λ, but each user 30 has only a portion of the waveband dedicated for his/her use.

Usually, wavelength λ changes due to temperature are around 0.1 nm/degree Celsius. DFB lasers 300 are usually more spectrally pure than other laser diodes, which minimizes crosstalk/overlap during multiplexing of several channels for simultaneous transmission. The DFB laser 300 has a thin active region sandwiched between p- and n-type cladding layers 330, 340 of a higher bandgap. The feedback mechanism (grating 310) is distributed through the cavity length by means of an internal built in Bragg grating 310. The grating 310 induces a periodic variation of the index, which in turn leads to the wavelength dependent interference of waves in the forward and backward propagation directions.

In very general terms, the operation wavelength of a DFB laser 300 is determined from Bragg's Law as shown in Eq. 1, $$\Lambda = m\lambda/2 \tag{1}$$

where $\Lambda$ is the distance between adjacent grating peaks known as the grating period, λ is the wavelength as measured in the diode, and m is the order of the Bragg diffraction.

To determine the wavelength in a specific material, the free-space wavelength should first be determined using the Eq. 2, $$\lambda = \lambda_0/n \tag{2}$$

where $\lambda_0$ is the free-space wavelength and n is the refractive index of the DFB laser 300. Therefore, each DFB laser 300 in the series of DFB laser array 210 has a different grating 310 in order to lase or output an optical signal 305 at a different wavelength from the other DFB lasers 300 within the DFB laser array 210.

Each DFB laser 300 is configured to output an optical signal 305 within a different temperature dependant tunable range of wavelengths. Therefore, one transmitter (i.e., tunable laser 200 at the ONU 60) may be used by each user 30 and each transmitter 200 may be tuned to a different wavelength λ. Since the wavelength tunable laser 200 emits one amplified optical signal 205 from one of the DFB lasers 300 that is based on the desired wavelength for a specific user 30.

Mode hopping occurs when a laser jumps from a first optical frequency to a second optical frequency. Mode hopping is usually caused by external influences such as current modulation of the laser gain itself. Decoupling of the laser longitudinal mode and Bragg wavelength selection (such as in a DBR laser), causes different rates of change in the lasing wavelength determining components, thus causing mode hopping. The fact that the longitudinal mode and Bragg grating are coupled/stacked, as well as single mode lasing of the DFB laser 300, prevents the mode hopping that may be problematic to tunable lasers.

Temperature tuned DFB lasers usually suffer from limited tuning range, which is limited to the achievable Δn/n over the tuning temperature range. In order to achieve better overall tuning range, a series of DFB lasers, each covering a small tuning range can be cascaded, as shown in FIG. 2, to produce a tunable laser with larger overall tuning range. At any moment of the operation, only one of the tunable DFB laser is turned on depending on the desirable output wavelengths. The DFB lasers 300 in between the desired lasing DFB laser 300 and the SOA 220 are biased in a transparent mode (non-lasing mode) to allow an optical signal from the desired DFB laser 300 to pass through and emit from the output end 212 of the DFB laser array 210. The SOA 220 provides optical gain to compensate for the signal attenuations on the optical path.

The SOA 220 is optically connected to the distributed feedback portion 210. An SOA 220 amplifies an optical signal 305 without having to convert the optical signal 305 to an electrical signal first. SOAs 220 use a semiconductor to provide the gain medium. SOAs 220 may be constructed using stimulated emission in a material that has gain, which means a laser without mirrors or a laser with mirrors but operating just below the lasing threshold. The SOA 220 amplifies and modulates the optical signal 305 (from the distributed feedback portion 210) into an amplified optical signal 205 based on which DFB laser 300 outputs the optical signal 305. For example, within the distributed feedback portion 210, DFB lasers 300a-300n are aligned in series with DFB laser 300a being furthest away from the SOA 220. The SOA 220 amplifies the DFB laser 300a that is furthest away more than any of the other DFB lasers 300b-n, as the other DFB lasers 300b-n partially absorb the output of the lasing DFB laser 300a. Thus, the closer the DFB laser 300 to the SOA 220, the less the SOA 220 may amplify the optical signal 305, if a uniform output is desired for all wavelengths. The SOA 220 includes an adjustable gain, which adjusts the gain (amplification) depending on the DFB laser 300 outputting a signal 305. In some implementations, the DFB lasers 300a-n are current modulated and the SOA 220 only provides gain, with no modulation function.

The SOA 220 at the end of the array structure 210 allow for a reduced length of the individual DP % 300, because the large gain is limited to the SOA 220 and not to each individual DFB laser 300. Thus, reducing gain and length for each of the DFB lasers 300 reduces the overall length, size, and subsequently cost of the tunable wavelength laser 200. Moreover, modulation of the SOA 220 instead of the DFB lasers 300 results in one combined modulated section, instead of the plurality of modulated DFB lasers 300. The combined modulation section prevents the need for a high speed electrical switch to determine and direct which DFB laser 300 emits the optical signal. It also helps keep the optical output signal spectrally cleaner, by preventing direct modulation of DFB currents, which may cause spectral shifts of the output signal.

The TEC 230 controls the temperature of the distributed feedback portion 210. The TEC 230 creates a heat flux between junctions of two types of materials being different materials. The TEC 230 transfers heat from one side of first device to a second side of a second device. The TEC may be used for heating or cooling a device. In some examples, it is used as a temperature controller that either heats or cools a device. Thermoelectric effects operate the TEC 230 by transferring heat from one side of the TEC to another side of the TEC when a direct current 242 flows through the device. TEC 230 may be controlled by changing the input voltage/current.

The tunable wavelength laser 200 provides a high extinction ratio (ER) of the output signal 205, as a result of the decoupling of ER with laser speed, as normally with a laser, high bias current (and low ER) is needed to increase speed of the laser. The Extinction ratio (ER) is the ratio used to describe the performance of an optical transmitter used in digital communications. The ER is the ratio of the energy (power) used to transmit a logic level '1', to the energy used to transmit a logic level '0'. Therefore, if the '1' power level was 1000 microwatts and the '0' power level was 50 microwatts, the ER would be 20 (or 13 dB).

The controller 240 may be in communication with the distributed feedback portion 210, the SOA 220, and/or the TEC 230. The controller 240 controls activation of each DFB laser 300 by activating one DFB laser at a time to output an optical signal 305 that is amplified by the SOA 220 and outputted as an amplified optical signal 205 before being transmitted to the CO 40. The controller 240 controls the TEC 230 to change a temperature of the distributed feedback portion 210 to be a lasing temperature within the temperature dependent tunable wavelength range of one of the distributed feedback lasers. In some examples, the controller 240 is in communication with the CO 40 that specifies which wavelength λ a specific transmitter 300, i.e., tunable wavelength laser 200, should transmit an optical signal 205.

In some examples, the controller 240 is in communication with the SOA 220 and sets a gain of the SOA 220 to amplify the optical signal by an amplification that is dependent on a position of the DFB laser 300 within the series of DFB lasers 300 of the distributed feedback portion 210. The controller 240 may also set a modulation of the SOA 220 corresponding to the DFB laser 300 outputting the optical signal 305.

In some examples, the tunable wavelength laser 200 includes a substrate 250. A substrate 250 may be a solid layer of material onto which one or more other materials adheres, such as the TEC 230, the distributed feedback portion 210, and the SOA 220. In some examples, the substrate 250 is a thin slice of material made of silicon, silicon dioxide, aluminum oxide, sapphire, germanium, gallium, arsenide, an alloy of silicon and germanium, or indium phosphide. The substrate 250 may acts as the base that holds some or all of the components that make up wavelength tunable laser 200.

Figure 4:
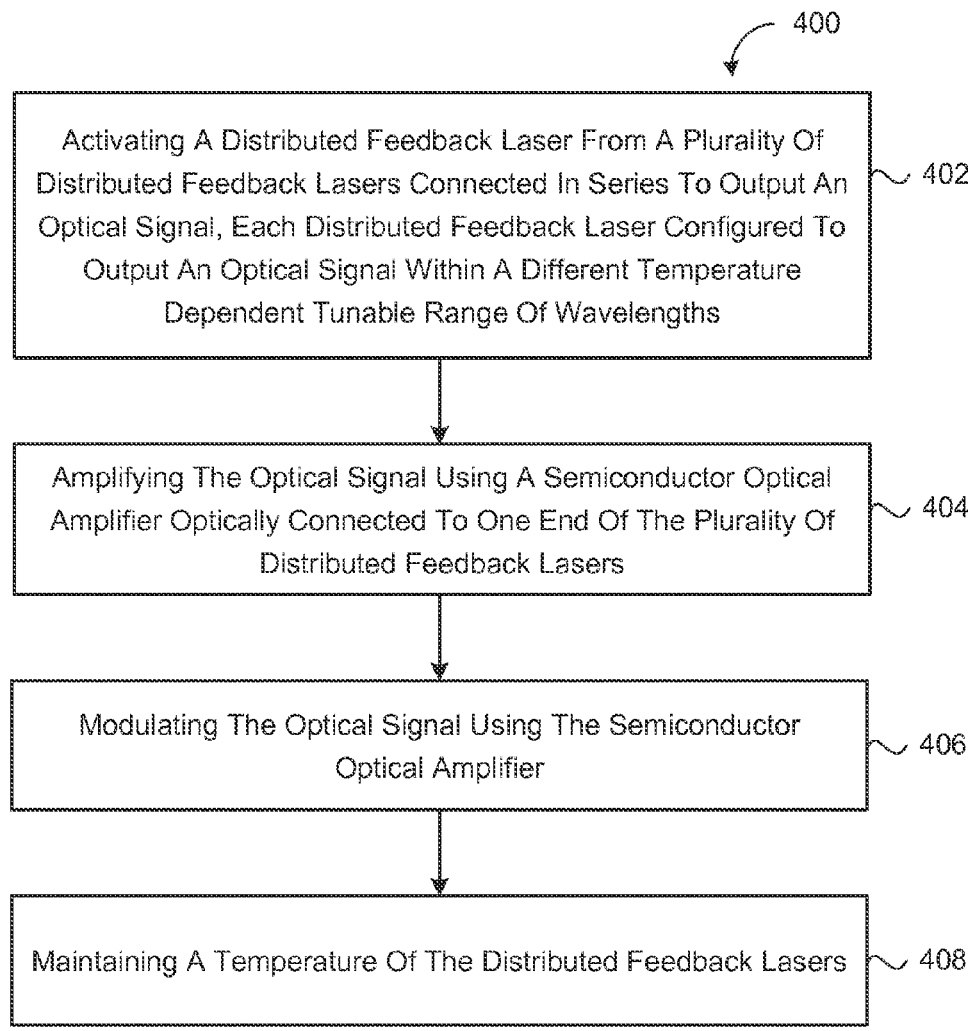
FIG. 4 is a schematic view of an exemplary arrangement of operations for tuning optical signals.

FIG. 4 provides an exemplary arrangement of operation for a method 400 of tuning optical signals. The method 400 includes activating 402 a DFB laser 300 from a plurality of distributed feedback lasers 210 that are connected in series to output an optical signal 305. Each DFB laser 300 is configured to output an optical signal 305 within a different temperature dependent tunable range of wavelengths λ. The method 400 includes amplifying 404 the optical signal 305 using an SOA 220. The SOA 220 is optically connected to one end 212 of the plurality of DFB lasers 300. The method also includes modulating 406 the optical signal 305 using the SOA 220. The method 400 further includes maintaining 408 a temperature of the DFB lasers 300.

In some implementations, the method 400 further includes amplifying the optical signal 305 based on a position of the activated DFB laser 300 in the series 210 of DFB lasers 300 with respect to the SOA 220. Additionally, the method 400 may include amplifying the optical signal 305 of a first DFB lasers 300a greater than a second DFB lasers 300b-n. The first DFB lasers 300a is positioned in the series 210 of DFB lasers 300 further away from the SOA 220 than the second DFB lasers 300b-n. Therefore, the further the DFB laser 300 is from the SOA 220, the more amplification is used for the optical signal 305 outputted from the DFB laser 300. The method 400 may include activating one DFB lasers 300 at a time to output the optical signal 305.

In some examples, the method 400 further includes setting a gain of the SOA 220 to amplify the optical signal 305 by an amplification dependent on a position in the series of DFB lasers (i.e., the distributed feedback portion 210) of the DFB lasers 300 outputting the optical signal 305 with respect to the SOA 220. The method 400 may also include setting a modulation of the SOA 220 where the modulation corresponds to the DFB laser 300 outputting the optical signal 305.

The method 400 may further include altering a temperature of the DFB lasers 300 to be a lasing temperature within the temperature dependent tunable wavelength range of one of the DFB lasers 300. Additionally or alternatively, the method 400 may include controlling a refractive index of each of the DFB lasers 300 by maintaining the temperature of the distributed feedback lasers. The refractive index controls the optical signal outputted within a different temperature dependent tunable range of wavelengths λ. In some examples, the method 400 includes calibrating a wavelength λ of an optical signal 305 at first and second temperature extremes of a collective range of the temperature dependent tunable range of wavelengths λ.

Each DFB laser 300 may include an optical grating 310 for reflecting light, where the optical grating 310 of each DFB laser 300 is different than another optical grating 310 of any other DFB laser 300. Additionally or alternatively, the series 210 of distributed feedback lasers 300 may include a head DFB laser 300a and an end DFB laser 300n. The end DFB laser 300n is optically connected to the semiconductor optical amplifier and any optical signals 305 from the other DFB laser 300 passing through the end DFB laser 300n.

A number of implementations have been described. Nevertheless, it will be understood that various modifications may be made without departing from the spirit and scope of the disclosure. Accordingly, other implementations are within the scope of the following claims.

What is claimed is:

1. A wavelength tunable laser comprising:
   a thermo-electric cooler;
   a distributed feedback portion disposed on the thermo-electric cooler and having a plurality of distributed feedback lasers connected in series, each distributed feedback laser configured to output an optical signal within a different temperature dependent tunable range of wavelengths, the distributed feedback portion outputting an optical signal from one of the distributed feedback lasers; and
   a semiconductor optical amplifier optically connected to one end of the distributed feedback portion, the semiconductor optical amplifier amplifying and modulating the optical signal outputted from the distributed feedback portion;
   wherein the semiconductor optical amplifier amplifies and modulates the optical signal based on a location of which a distributed feedback laser within the series of distributed feedback lasers outputs the optical signal, the semiconductor optical amplifier amplifying the optical signal of a first distributed feedback laser greater than a second distributed feedback laser, wherein the first distributed feedback laser is positioned in the series of distributed feedback lasers further away from the semiconductor optical amplifier than the second distributed feedback laser.

2. The wavelength tunable laser of claim 1, wherein the distributed feedback portion outputs an optical signal from one of the distributed feedback lasers having a temperature dependent tunable wavelength range encompassing a temperature of the distributed feedback portion, the temperature of the distributed feedback portion controlled by the thermo-electric cooler.

3. The wavelength tunable laser of claim 1, further comprising a controller in communication with the distributed feedback portion for controlling activation of each distributed feedback laser, the controller activating one distributed feedback laser at a time to output the optical signal.

4. The wavelength tunable laser of claim 3, wherein the controller is in communication with the semiconductor optical amplifier, the controller:
   sets a gain of the semiconductor optical amplifier to amplify the optical signal by an amplification dependent on a position in the series of distributed feedback lasers of the distributed feedback laser outputting the optical signal with respect to the semiconductor optical amplifier; and
   sets a modulation of the semiconductor optical amplifier, the modulation corresponding to the distributed feedback laser outputting the optical signal.

5. The wavelength tunable laser of claim 4, wherein the controller is in communication with the thermo-electric cooler, the controller controlling the thermo-electric cooler to change a temperature of the distributed feedback portion to be a lasing temperature within the temperature dependent tunable wavelength range of one of the distributed feedback lasers.

6. The wavelength tunable laser of claim 1, wherein each distributed feedback laser comprises an optical grating for reflecting light, the optical grating of each distributed feedback laser being different than another optical grating of any other distributed feedback laser within the distributed feedback portion.

7. The wavelength tunable laser of claim 1, wherein each distributed feedback laser within the distributed feedback portion is associated with a different grating pitch, the grating pitch being different for each distributed feedback laser outputting a different temperature dependent tunable range of wavelengths, the index of refraction changing with a change in temperature.

8. The wavelength tunable laser of claim 1, wherein each distributed feedback laser within the distributed feedback portion is calibrated at first and second temperature extremes of a collective range of the temperature dependent tunable range of wavelengths.

9. A method of tuning optical signals comprising:
   activating a distributed feedback laser from a plurality of distributed feedback lasers connected in series to output an optical signal, each distributed feedback laser configured to output an optical signal within a different temperature dependent tunable range of wavelengths;
   amplifying the optical signal using a semiconductor optical amplifier optically connected to one end of the plurality of distributed feedback lasers by:
      amplifying the optical signal based on a position of the distributed feedback laser in the series of distributed feedback lasers within the plurality of distributed feedback lasers with respect to the semiconductor optical amplifier; and
      amplifying the optical signal of a first distributed feedback laser greater than a second distributed feedback laser, wherein the first distributed feedback laser is positioned in the series of distributed feedback lasers further away from the semiconductor optical amplifier than the second distributed feedback laser;
   modulating the optical signal using the semiconductor optical amplifier; and
   maintaining a temperature of the distributed feedback lasers.

10. The method of claim 9, further comprising activating one distributed feedback laser at a time to output an optical signal.

11. The method of claim 9, further comprising:
   setting a gain of the semiconductor optical amplifier to amplify the optical signal by an amplification dependent on a position in the series of distributed feedback lasers of the distributed feedback laser outputting the optical signal with respect to the semiconductor optical amplifier; and setting a modulation of the semiconductor optical amplifier, the modulation corresponding to the distributed feedback laser outputting the optical signal.

12. The method of claim 9, further comprising altering a temperature of the distributed feedback lasers to change a lasing wavelength within the temperature dependent tunable wavelength range of one of the distributed feedback lasers.

13. The method of claim 9, further comprising controlling a refractive index of each of the distributed feedback lasers by maintaining the temperature of the distributed feedback lasers, the refractive index controlling the optical signal outputted within a different temperature dependent tunable range of wavelengths.

14. The method of claim 9, further comprising calibrating a wavelength of an optical signal at first and second temperature extremes of a collective range of the temperature dependent tunable range of wavelengths.

15. The method of claim 9, wherein each distributed feedback laser comprises an optical grating for reflecting light, the optical grating of each distributed feedback laser being different than another optical grating of any other distributed feedback laser.

16. The method of claim 9, wherein the series of distributed feedback lasers comprises a head distributed feedback laser and an end distributed feedback laser, the end distributed feedback laser optically connected to the semiconductor optical amplifier, any optical signals from the other distributed feedback lasers passing through the distributed feedback lasers in between the other distributed feedback laser emitting an optical signal and the end distributed feedback laser.

* * * * *